(12) United States Patent
Hsieh et al.

(10) Patent No.: US 7,537,884 B2
(45) Date of Patent: May 26, 2009

(54) METHOD FOR FORMING SELF-SYNTHESIZING CONDUCTIVE OR CONJUGATED POLYMER FILM AND APPLICATION

(75) Inventors: Kuo-Huang Hsieh, Taipei (TW); Man-Kit Leung, Taipei (TW); King-Fu Lin, Taipei (TW); Wen-Yen Chiu, Taipei (TW); Wen-Chang Chen, Taipei (TW); Lee-Yih Wang, Taipei (TW); Wen-Bin Liau, Taipei (TW); Chi-An Dai, Taipei (TW); Wei-Fang Su, Taipei (TW); Hung-Chun Chang, Taipei (TW); Hung-Ren Wang, Taipei (TW); Chao-Hui Kuo, Taipei (TW); Chi-Shin Lee, Taipei (TW); Jun-Ming Huang, Taipei (TW); Cheng-Yuan Shih, Taipei (TW)

(73) Assignee: National Taiwan University, Taipei (TW)

( * ) Notice: Subject to any disclaimer, the term of this patent is extended or adjusted under 35 U.S.C. 154(b) by 727 days.

(21) Appl. No.: 10/968,104

(22) Filed: Oct. 20, 2004

(65) Prior Publication Data
US 2006/0084009 A1 Apr. 20, 2006

(51) Int. Cl.
*G03F 1/00* (2006.01)

(52) U.S. Cl. ................ 430/322; 430/311; 430/302; 430/315

(58) Field of Classification Search ............... 430/311, 430/269, 302, 315, 321, 322, 325, 331, 20; 252/500; 428/1.1, 1.5, 1.6; 257/40
See application file for complete search history.

(56) References Cited

U.S. PATENT DOCUMENTS

| | | | | |
|---|---|---|---|---|
| 5,408,109 A * | 4/1995 | Heeger et al. | ................ | 257/40 |
| 5,674,660 A * | 10/1997 | Olson et al. | ............ | 430/284.1 |
| 5,900,327 A * | 5/1999 | Pei et al. | .................... | 428/690 |
| 6,114,099 A * | 9/2000 | Liu et al. | .................... | 430/324 |
| 6,319,643 B1 * | 11/2001 | Singh et al. | ................. | 430/30 |
| 6,445,126 B1 * | 9/2002 | Arai et al. | ................... | 313/504 |
| 6,465,147 B1 * | 10/2002 | Lee et al. | ................. | 430/270.1 |
| 2001/0053500 A1 * | 12/2001 | Jeoung et al. | ............... | 430/311 |

* cited by examiner

*Primary Examiner*—Thorl Chea
(74) *Attorney, Agent, or Firm*—WPAT, P. C.; Justin King

(57) ABSTRACT

The present invention discloses a method by utilizing chemical reaction or specific attractive forces (complexation or hydrogen bonding) for forming self-synthesizing conductive or conjugated polymer film and its application. First of all, at least one photoresist layer with a first functional group and a specific pattern is formed, so that the first functional group can bond a second functional group of a conductive or conjugated polymer unit, whereby a conductive or conjugated polymer film with specific pattern is formed. Furthermore, this invention can be applied for forming emitting films, especially for forming emitting layers of OLED/PLED elements.

5 Claims, 11 Drawing Sheets

METHOD FOR FORMING SELF-SYNTHESIZING CONDUCTIVE OR CONJUGATED POLYMER FILM AND APPLICATION

BACKGROUND OF THE INVENTION

1. Field of the Invention

The present invention is related to a method for forming conductive or conjugated polymer film, and more particularly, to a method for forming self-synthesizing organic light emitting diode or polymeric light emitting diode (OLED/PLED) film.

2. Description of the Prior Art

Conventional method for forming transparent, conductive films is to add ITO (indium tin oxide) onto a glass substrate by vacuum evaporation/sputtering, whereby an ITO conductive glass is formed. The ITO glass has the advantage of its firmness, heat resistance, flat surface morphology and good optical features. With these advantages, the ITO glass is largely utilized for the conductive layer of an LCD monitor or a touch pad; however, developments of substitutes are still of great interest due to the weight issue, fragileness, inability to be rolled and high manufacturing costs caused by production of artificial vacuum circumstances. The rollable substrate has gained huge popularity in recent years in that it meets the growing need for small and light products better and that it can be manufactured by the roll-to-roll method which has a relatively low cost. Currently, the rollable substrate is produced by adding ITO onto a polymer substrate by vacuum evaporation/sputtering. However, this method has disadvantages of its own: first of all, the plastic is in general not a good heat-resisting material; second, production of artificial vacuum circumstances is highly costly; and third, the produced conductive or conjugated polymer film has a potential problem of peeling away from the substrate due to the weak adhesion strength between organic and inorganic substances.

The essential elements of an organic light emitting diode include a single layer of light emitting organic semi-conductor deposition between an upper metal cathode and a lower transparent anode. In the traditional way, elements are fabricated on the transparent substrate such as glass, and the transparent anode is made of the transparent conductor of ITO. When a forward bias is applied between the cathode and the anode, electric holes and electrons are introduced into the semi-conductor in the mean time through the cathode and the anode, respectively. The two carriers meet while transferring in the membrane and, when meeting, they generate photons via radiative recombination; the photos then travel all the way out of the system through the transparent cathode and the substrate and give off visible light rays. The underlying mechanism for an organic light emitting diode to emit light is the carrier recombination as mentioned above, thus to improve the efficiency of an organic light emitting diode, one has to balance the introduction rate and the transfer rate of the two carriers(the electric holes and the electrons), so as to improve the efficiency of recombination in the light emitting layer. A common method to achieve this is to take advantage of a multi-layered organic light emitting diode element, wherein a multi-layered organic light emitting diode is structured with an ITO, a hole transporting layer(HTL), an light emitting layer(EML), an electron transport layer(ETL), and metal. However, this multi-layer structure may also have the problem of being flaky due to the weak adhesion strength between organic and inorganic substances.

Accordingly, a new forming process is needed for the conductive or conjugated polymer film, the light emitting membrane and the light emitting layer of an organic light emitting diode (OLED/PLED) in order to equip them with good interfacial adhesiveness and mechanical strength, through which to correspond to industrial utilizations.

SUMMARY OF THE INVENTION

In accordance with the present invention, a method for forming a self-synthesizing conductive or conjugated polymer film and applications thereof is provided to meet requirements of industrial utilizations.

One of the objects of the present invention is to provide a photoresist agent. Common photoresist agents used in the semi-conductor manufacturing process has no specific functional groups, thus the photoresist layer formed in the lithographic has to be removed in later etching steps, which elongates the entire process. On contrary, by adding specific functional groups to the photoresist agent, the present invention can spare the photoresist layer removal step and directly utilize those added specific functional groups to link other chemical components that are to be added. Another object of the present invention is to exploit the molecular-scale design and interactions between different functional groups to synthesize a membrane from a conductive polymer unit and other chemical components. The method provided by the present invention has the advantage of combining several functional organic materials together onto a single membrane.

Still another object of the present invention is to employ conductive particles with a core-shell structure for synthesizing a conductive/light emitting membrane with high conductivity and transparency.

Accordingly, the present invention discloses a method by utilizing chemical reaction or specific attractive forces (complexation or hydrogen bonding) for forming self-synthesizing conductive or conjugated polymer film and its application. First of all, at least one photoresist layer with a first functional group and a specific pattern is formed, so that the first functional group can bond (in this disclosure, "bond" is referred to chemical reaction or specific attractive forces as mentioned) a second functional group of a conductive or conjugated polymer unit, whereby a conductive or conjugated polymer film with specific pattern is formed. Furthermore, this invention can be applied for forming emitting films, especially for forming emitting layers of OLED/PLED elements.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENTS

Figure 1:
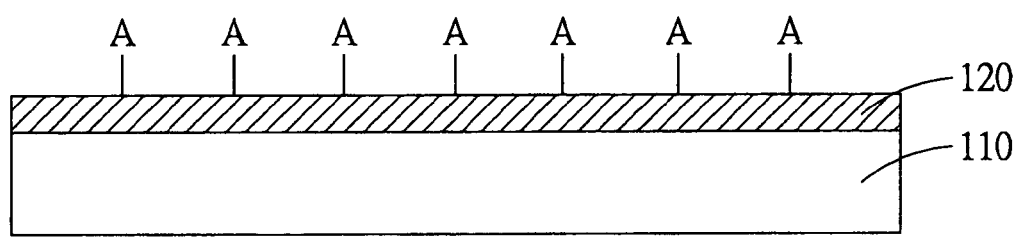
FIG. 1 is schematic diagram of a method of coating a specific photoresist agent onto a substrate in accordance with a third embodiment of the present invention.

What is probed into in the invention is about a self-synthesizing conductive or conjugated polymer film. Detailed descriptions of the production, structure and elements will be provided in the following in order to make the invention thoroughly understood. Obviously, the application of the invention is not confined to specific details familiar to those who are skilled in the conductive or conjugated polymer film. On the other hand, the common elements and procedures that are known to everyone are not described in details to avoid unnecessary limits of the invention. Some preferred embodiments of the present invention will now be described in greater detail in the following. However, it should be recognized that the present invention can be practiced in a wide range of other embodiments besides those explicitly described, that is, this invention can also be applied extensively to other embodiments, and the scope of the present invention is expressly not limited except as specified in the accompanying claims.

In a first embodiment of the present invention, a method for forming a photoresist agent is provided. In this embodiment, there is firstly provided at least one first polymer unit wherein the at least one first polymer unit is selected from a group consisting of: acrylate, styrene, norbornene, alicylclic, silsesquioxane, and derivatives thereof. The at least one first polymer unit further comprises at least one oligomer. Afterwards, modify the at least one first polymer unit to make it to have a first functional group. The first functional group is used to bond a substance with a second functional group, wherein the substance is a second polymer unit and the second functional group is added to the second polymer unit by modifying the second polymer unit. The second polymer unit comprises either conductive or conjugated polymer unit, wherein the second conductive polymer unit is selected from a group consisting of: aniline, pyrrole, thiophene, furan, acetylene, phenylene sulfide, and derivatives thereof. The second polymer unit further comprises conductive or conjugated oligomer. Alternatively, the substance mentioned above can be selected from a group consisting of:

(1) diisocyanate family (with general formula as shown below, wherein R is selected from a group consisting of: alkyl group, benzene ring and any combination thereof).

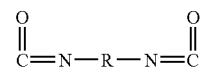

(2) dialdehyde family (with general formula as shown below, wherein R is selected from a group consisting of: alkyl group, benzene ring and any combination thereof).

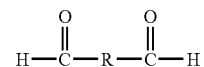

(3) dihalide family (with general formula as X—R—X, wherein R is selected from a group consisting of: alkyl group, benzene ring and any combination thereof, and X is Br, Cl or I.

(4) diorganohalide family, such as diacyl halide family (with general formula as shown below, wherein R is selected from a group consisting of: alkyl group, benzene ring and any combination thereof, and X is Br, Cl or I.

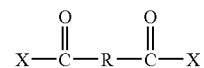

The first functional and second functional group are selected from a group consisting of: sulfonic group, hydroxyl group, amine group, carboxylic acid group, epoxy group, isocyanate group, organic halide group, acyl halide group and aldehyde group. Next, pre-polymerize the at least one first polymer unit with the first functional group to form an intermediate solution. Finally, add an initiating agent to the intermediate solution to form a photoresist agent with the first functional group; the photoresist agent can further comprise at least one of the following: a binder and a curing agent.

In a second embodiment of the present invention, another method for forming a photoresist agent is provided. In this embodiment, there is firstly provided at least one first polymer unit wherein the at least one first polymer unit is selected from a group consisting of: acrylate, styrene, norbornene, alicylclic, silsesquioxane, and derivatives thereof. The at least one first polymer unit further comprises at least one oligomer. Afterwards, modify the at least one first polymer unit to make it to have a first functional group. The first functional group is used to bond a substance with a second functional group, wherein the substance is a second polymer unit and the second functional group is added to the second polymer unit by modifying the second polymer unit. The second polymer unit comprises either conductive or conjugated polymer unit, wherein the second conductive polymer unit is selected from a group consisting of: aniline, pyrrole, thiophene, furan, acetylene, phenylene sulfide, and derivatives thereof. The second polymer unit further comprises conductive or conjugated oligomer. Alternatively, the substance mentioned above can be selected from a group consisting of:

(1) diisocyanate family (with general formula as shown below, wherein R is selected from a group consisting of: alkyl group, benzene ring and any combination thereof.

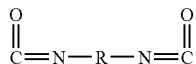

(2) dialdehyde family (with general formula as shown below, wherein R is selected from a group consisting of: alkyl group, benzene ring and any combination thereof).

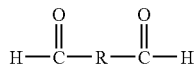

(3) dihalide family (with general formula as X—R—X, wherein R is selected from a group consisting of: alkyl group, benzene ring and any combination thereof, and X is Br, Cl or I.

(4) diorganohalide family, such as diacyl halide family (with general formula as shown below, wherein R is selected from a group consisting of: alkyl group, benzene ring and any combination thereof, and X is Br, Cl or I.

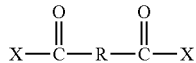

The first functional and second functional group are selected from a group consisting of sulfonic group, hydroxyl group, amine group, carboxylic acid group, epoxy group, isocyanate group, organic halide group, acyl halide group and aldehyde group. Then, the at least one first polymer unit which is not modified (i.e. having no the first functional group) and the at least one first polymer unit which is modified (i.e. having the first functional group) are blended to form an admixture. What should be noticed is, the higher the proportion of the first polymer unit having the first functional group is, the stronger the adhesion of resulted photoresist agent will be. Next, pre-polymerize the admixture to form an intermediate solution. Finally, add an initiating agent to the intermediate solution to form a photoresist agent with the first functional group, wherein the photoresist agent can further comprise at least one of the following: a binder and a curing agent.

Figure 2:
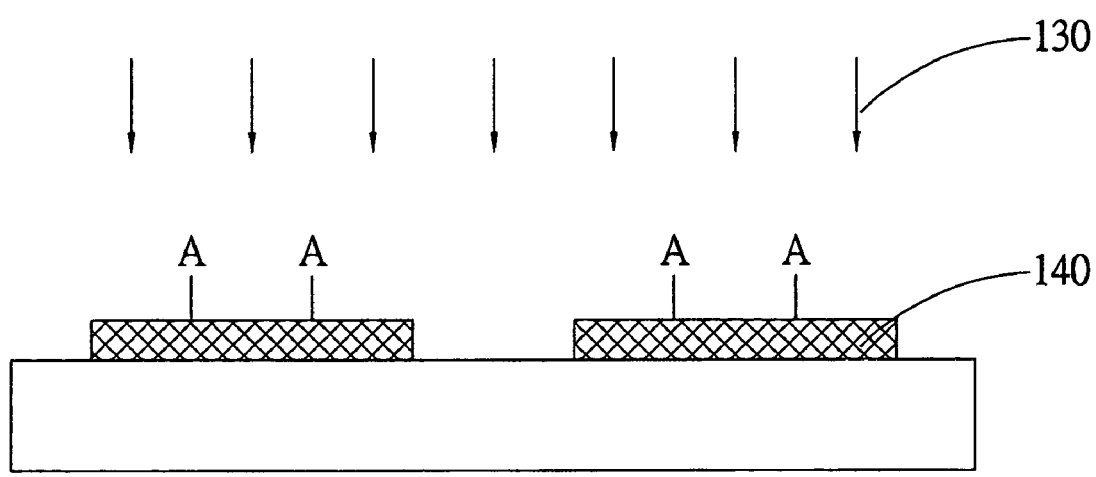
FIG. 2 is a schematic diagram of a method of forming at least one specifically patterned photoresist layer on a substrate via a lithographic process in accordance with a third embodiment of the present invention.

Referring to FIG. 1 and FIG. 2, in a third embodiment of the present invention, a substrate 110 is firstly provided; the substrate 110 is selected from a group consisting of: polycarbonate (PC)-poly ethylene terephthalate (PET)-poly urethane (PU)-poly-methylmethacrylate (PMMA)-metallocene catalyzed cyclic olefin copolymer(mCOC)-indium tin oxide (ITO) membrane and derivatives thereof. Next, a photoresist agent 120 with a first functional group A is coated onto the substrate 110, and a lithographic process 130 is then performed to form at least one specifically patterned photoresist layer 140 with a crosslinking structure on the substrate 110.

Figure 3:
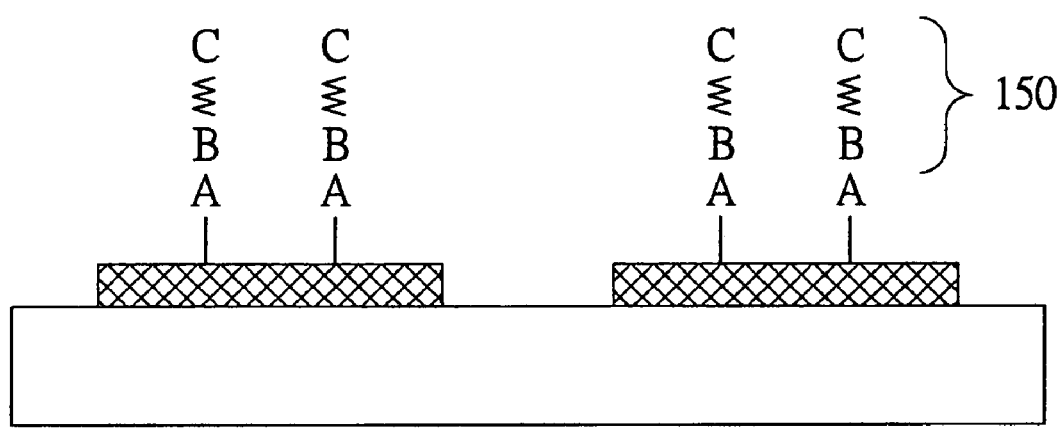
FIG. 3 is a schematic diagram of a method of forming a conductive or conjugated polymer film on the at least one specifically patterned photoresist layer by bonding a specific functional group of a conductive or conjugated polymer unit to another specific functional group of the photoresist layer in accordance with a third embodiment of the present invention.

Referring to FIG. 3, in this embodiment, after the photoresist layer 140 is formed, a first conductive or conjugated polymer unit is provided; the first conductive polymer unit is selected from a group consisting of: aniline, pyrrole, thiophene, furan, acetylene, phenylene sulfide, and derivatives thereof. The first conductive or conjugated polymer unit further comprises conductive or conjugated oligomer. Then, a second conductive or conjugated polymer unit 150 with a second functional group B and a third functional group C on the two ends of its molecular structure is formed by modifying the first conductive polymer unit, wherein the second functional group B is used to bond the first functional group A of the photoresist layer 140. The first functional group A, second functional group B and third functional group C in this embodiment are selected from a group consisting of: sulfonic group, hydroxyl group, amine group, carboxylic acid group, epoxy group, isocyanate group, organic halide group, acyl halide group and aldehyde group. What should be noticed is that the second functional group B and the third functional group C can be the same, but if they are different, the second functional group B, rather than the third functional group C, has a stronger bonding ability towards the first functional group A. Next, a membrane fabricating process is performed to form a conductive or conjugated polymer film on the at least one specifically patterned photoresist layer 140 by bonding the second functional group B of the second conductive or conjugated polymer unit 150 to the first functional group A of the at least one specifically patterned photoresist layer 140. What should be noticed is, the first conductive or conjugated polymer unit has a short-chain structure with less than 6 repeating units, in order to make sure the second functional group B and the third functional group C being on opposite ends of the second conductive polymer unit 150, and through which to keep the second functional group B and third functional group C of the second conductive or conjugated polymer unit 150 from bonding the at least one patterned photresist 140 simultaneously.

Figure 4:
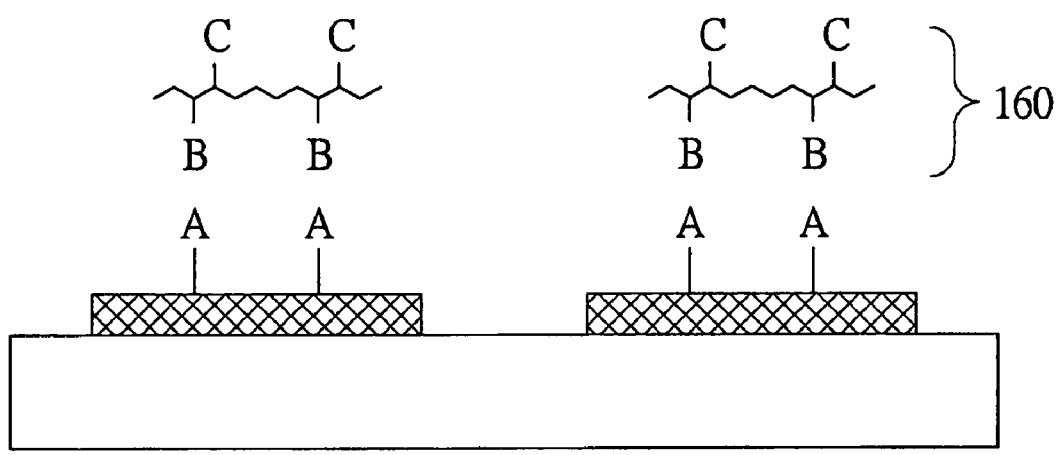
FIG. 4 is a schematic diagram of a method of forming a conductive or conjugated polymer film on the at least one specifically patterned photoresist layer by bonding a specific functional group of a conductive or conjugated oligomer to another specific functional group of the photoresist layer in accordance with a third embodiment of the present invention.

Referring to FIG. 4, in this embodiment, after the photoresist layer 140 is formed, a first conductive or conjugated oligomer is provided, the first conductive or conjugated oligomer is selected from a group consisting of: aniline, pyrrole, thiophene, furan, acetylene, phenylene sulfide, and derivatives thereof. Then, a second conductive or conjugated oligomer 160 with a second functional group B and a third functional group C on the two ends of its molecular structure is formed by modifying the first conductive or conjugated oligomer, wherein the second functional group B is used to bond the first functional group A of the photoresist layer 140. The first functional group A, second functional group B and third functional group C in this embodiment are selected from a group consisting of: sulfonic group, hydroxyl group, amine group, carboxylic acid group, epoxy group, isocyanate group, organic halide group, acyl halide group and aldehyde group. What should be noticed is that the second functional group B and the third functional group C can be the same, but if they are different, the second functional group B, rather than the third functional group C, has a stronger bonding ability towards the first functional group A. Next, a membrane fabricating process is performed to form a conductive or conjugated polymer film on the at least one specifically patterned photoresist layer 140 by bonding the second functional group B of the second conductive or conjugated oligomer 160 to the first functional group A of the at least one specifically patterned photoresist layer 140.

Figure 5:
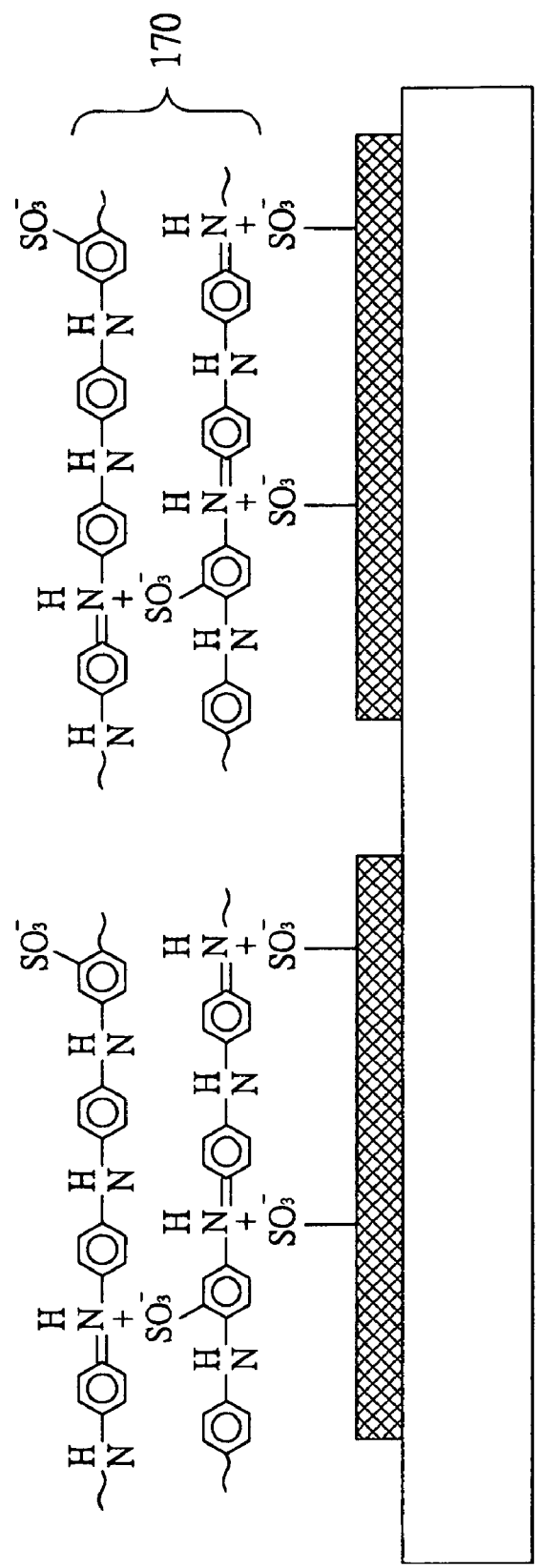
FIG. 5 is a schematic diagram of a method of forming a conductive membrane on the at least one specifically patterned photoresist layer by bonding a group containing nitrogen atoms and carrying a positive charge of a aniline oligomer to a sulfonic group of the photoresist layer in accordance with a third embodiment of the present invention.

Referring to FIG. 5, in this embodiment, after the photoresist layer 140 is formed; a first aniline oligomer is provided and modified to form a second aniline oligomer 170 with a sulfonic group. Then, an ionization process is performed to ionize the second aniline oligomer and produce a group containing nitrogen atoms and carrying a positive charge and a sulfonic group carrying a negative charge. The ionization process is performed with an acid solution wherein the acid solution is selected from a group consisting of: the solution of HCl, the solution of ammonium persulfate(APS), the solution of dl-10-camphorsulfonic acid(CSA), the solution of dodecylbenzene sulfonic acid(DBSA), the solution of alkylbenzene sulfonic acid, and derivatives thereof. Afterwards, another ionization process is performed to ionize at least one specifically patterned photoresist layer 140 on the substrate produce a sulfonic group carrying a negative charge. Finally, a membrane fabricating process is performed in an acid solution, wherein the acid solution is selected from a group consisting of: the solution of HCl, the solution of ammonium persulfate(APS), the solution of dl-10-camphorsulfonic acid (CSA), the solution of dodecylbenzene sulfonic acid(DBSA), the solution of alkylbenzene sulfonic acid, and derivatives thereof. In the membrane fabricating process, the group containing nitrogen atoms and carrying a positive charge of the second aniline oligomer 170 bonds at least one sulfonic group of the at least one specifically patterned photoresist layer 140, whereupon a conductive or conjugated polymer film is formed on the at least one specifically patterned photoresist layer 140.

Figure 6:
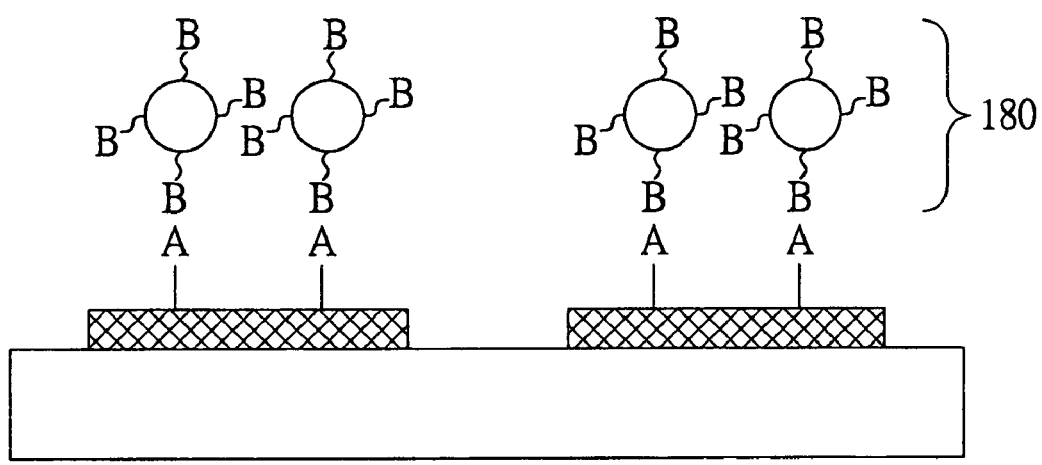
FIG. 6 is a schematic diagram of a method of forming a conductive membrane on the at least one specifically patterned photoresist layer by bonding a specific functional group of a conductive particle to another specific functional group of the photoresist layer in accordance with a third embodiment of the present invention.

Referring to FIG. 6, in this embodiment, after the photoresist layer 140 is formed, a conductive particle 180 is provided, the conductive particle 180 has at least one kind of non-conductive polymer for its core, at least one kind of conductive polymer for its shell, and at least one kind of ionic stabilizer. The shell has a second functional group B to bond the first functional group A of the photoresist layer 140. Finally, a membrane fabricating process is performed to form a conductive or conjugated polymer film on the at least one specifically patterned photoresist layer 140 by bonding the second functional group B of the conductive particale 180 to the first functional group A of the at least one specifically patterned photoresist layer 140.

Figure 7:
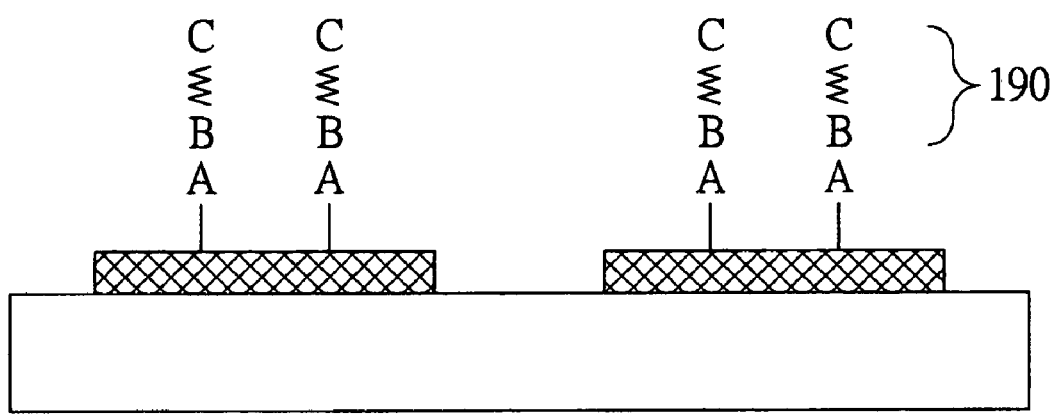
FIG. 7 is a schematic diagram of a method of bonding a specific functional group of a connecting agent to another functional group of at least one specifically patterned photoresist layer in accordance with a fourth embodiment of the present invention.

Referring to FIG. 1, FIG. 2 and FIG. 7, in a fourth embodiment of the present invention, a substrate 110 is firstly provided; the substrate 110 is selected from a group consisting of: polycarbonate (PC)-poly ethylene terephthalate (PET)-poly urethane (PU)-poly-methylmethacrylate (PMMA)-metallocene catalyzed cyclic olefin copolymer (mCOC)-indium tin oxide (ITO) membrane and derivatives thereof. Next, a photoresist agent 120 with a first functional group A is coated onto the substrate 110, and a lithographic process 130 is then performed to form at least one specifically patterned photoresist layer 140 with a crosslinking structure on the substrate 110. Afterwards, a connecting agent 190 with a second functional group B and a third functional group C is provided for performing a connecting process. The connecting agent 190 is selected from a group consisting of:

(1) diisocyanate family (with general formula as shown below, wherein R is selected from a group consisting of: alkyl group, benzene ring and any combination thereof).

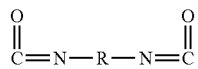

(2) dialdehyde family (with general formula as shown below, wherein R is selected from a group consisting of: alkyl group, benzene ring and any combination thereof).

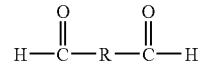

(3) dihalide family (with general formula as X—R—X, wherein R is selected from a group consisting of: alkyl group, benzene ring and any combination thereof, and X is Br, Cl or I.

(4) diorganohalide family, such as diacyl halide family (with general formula as shown below, wherein R is selected from a group consisting of: alkyl group, benzene ring and any combination thereof, and X is Br, Cl or I.

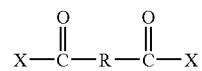

The connecting process is performed to bond the second functional group B of the connecting agent 190 to the first functional group A of the photoresist layer 140.

Figure 8:
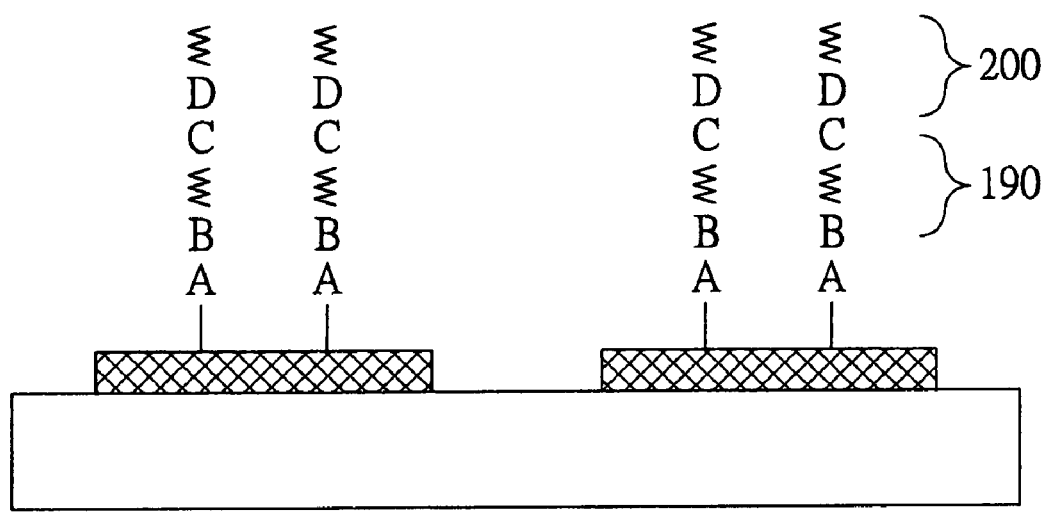
FIG. 8 is a schematic diagram of a method of bonding a specific functional group of a conductive or conjugated polymer unit to another functional group of at least one specifically patterned photoresist layer in accordance with a fourth embodiment of the present invention.

Referring to FIG. 8, in this embodiment, after the connecting process, a conductive or conjugated polymer unit 200 with a fourth functional group D is provided to bond the third functional group C of the connecting agent 190. The above mentioned first functional group A, second functional group B, third functional group C, and fourth functional group D are selected from a group consisting of: sulfonic group, hydroxyl group, amine group, carboxylic acid group, epoxy group, isocyanate group, organic halide group, acyl halide group and aldehyde group. What should be noticed is that the second functional group B and the third functional group C can be the same, but if they are different, the second functional group B, rather than the third functional group C, has a stronger bonding ability towards the first functional group A. Next, a membrane fabricating process is performed to form a conductive or conjugated polymer film on the at least one specifically patterned photoresist layer 140 by bonding the fourth functional group D of the conductive polymer unit 200 to the third functional group C of the connecting agent 190. What should be noticed is, the connecting agent 190 has a short-chain structure with less than 6 repeating units, in order to make sure the second functional group B and the third functional group C being on opposite ends of the connecting agent 190, and through which to keep the second functional group B and third functional group C of the connecting agent 190 from bonding the at least one patterned photresist 140 simultaneously.

Figure 9:
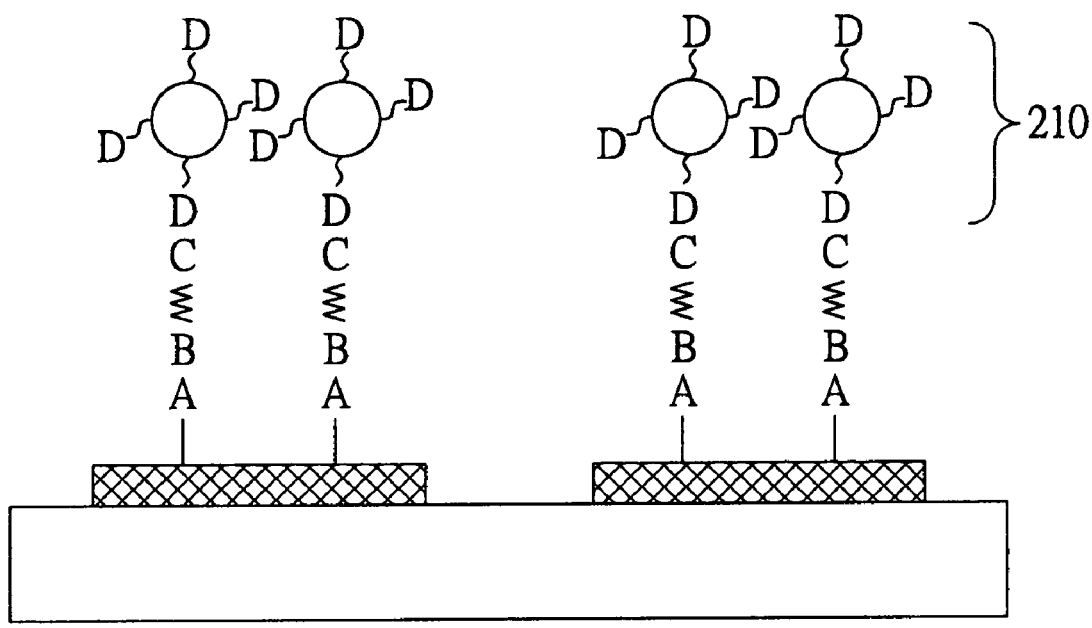
FIG. 9 is a schematic diagram of a method of bonding a specific functional group of a conductive particle to another functional group of at least one specifically patterned photoresist layer in accordance with a fourth embodiment of the present invention.

Referring to FIG. 9, in this embodiment, after the connecting process, a conductive particle 210 is provided, the conductive particle 210 has at least one kind of non-conductive polymer for its core, at least one kind of conductive polymer for its shell, and at least one kind of ionic stabilizer. The shell has a fourth functional group D to bond the third functional group C of the connecting agent 190. Finally, a membrane fabricating process is performed to form a conductive or conjugated polymer film on the at least one specifically patterned photoresist layer 140 by bonding the fourth functional group D of the conductive particale 210 to the third functional group C of the connecting agent 190.

Figure 10:
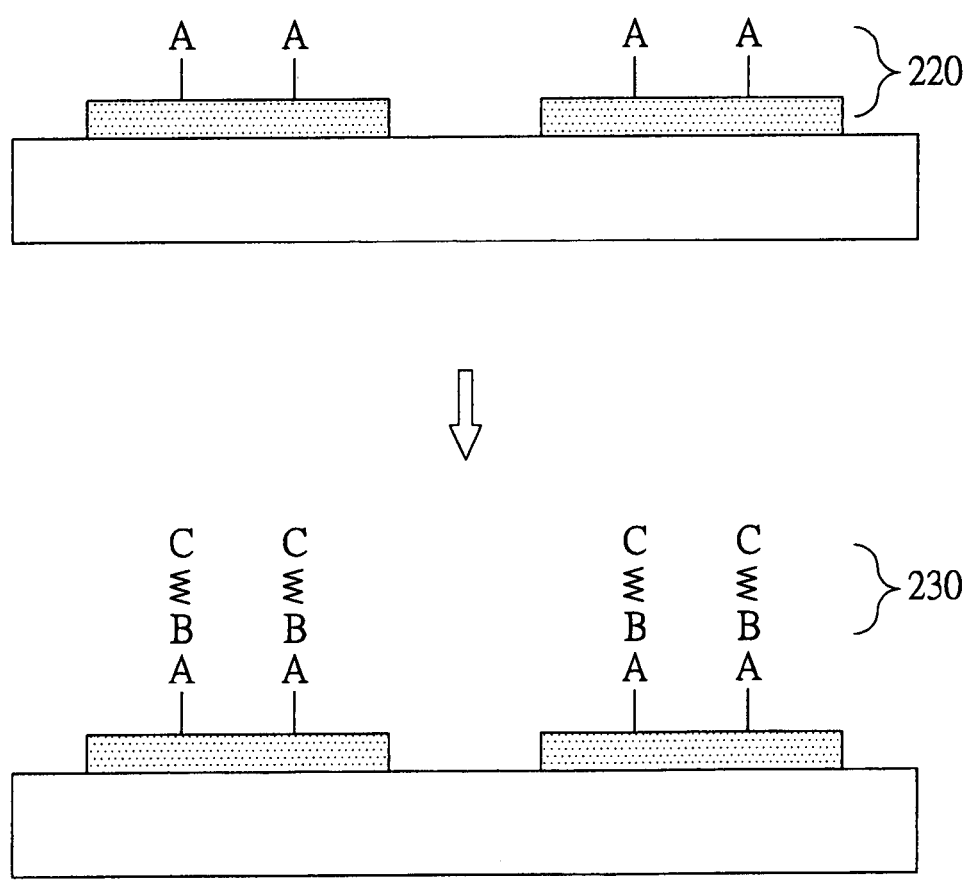
FIG. 10 is a schematic diagram of a method of forming a light emitting membrane on a conductive or conjugated polymer film by bonding a specific functional group of a light emitting or conjugated polymer unit to another specific functional group of the conductive or conjugated polymer film in accordance with a fifth embodiment of the present invention.

Referring to FIG. 10, in a fifth embodiment of the present invention, at least one patterned conductive or conjugated polymer film 220 is provided; the conductive or conjugated polymer film 220 has a first functional group A. Next, a first light emitting or conjugated polymer unit is provided; the first light emitting polymer unit is selected from a group consisting of:

(1) polyphenylenevinylene (PPV) family, such as:

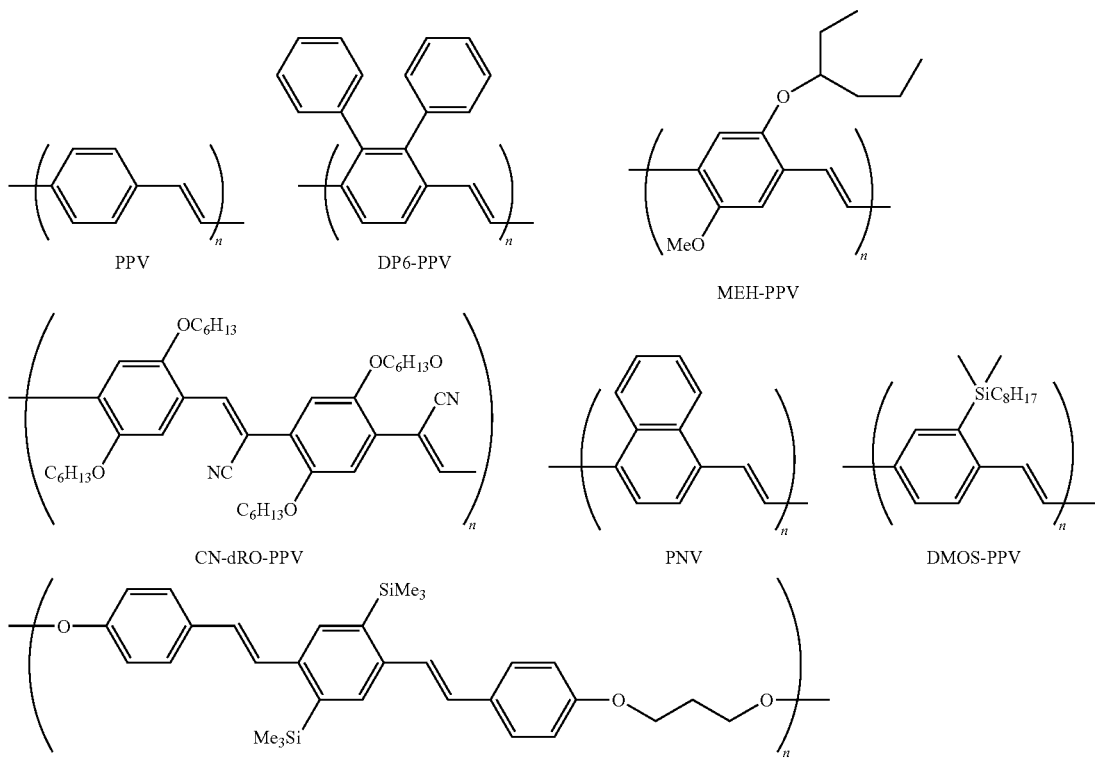

(2) PF(polyfluorene) and PPP family, such as:

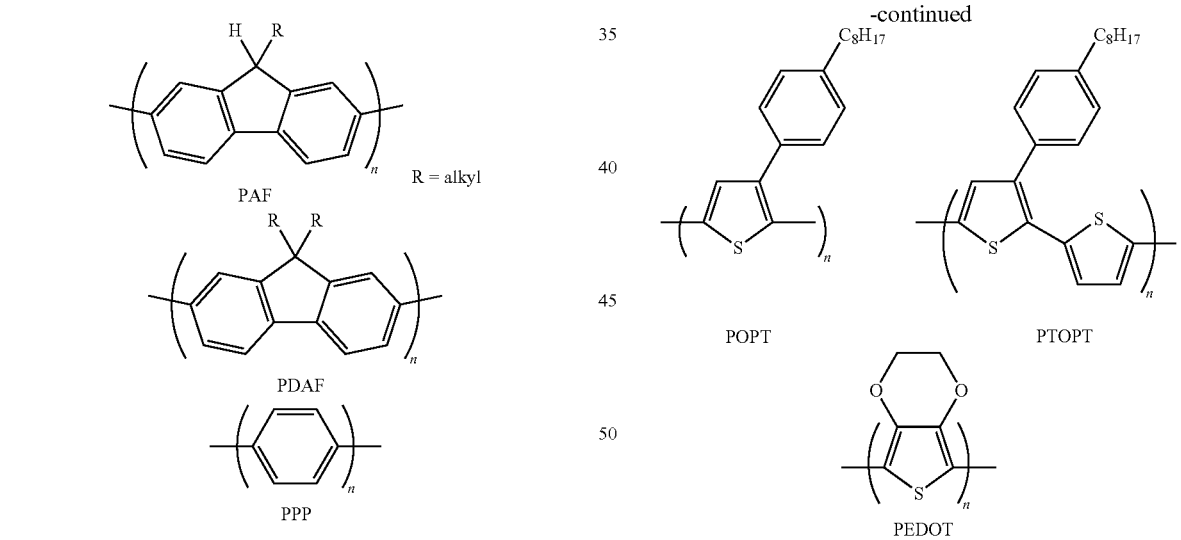

-continued (3) PT(polythiophene) family, such as:

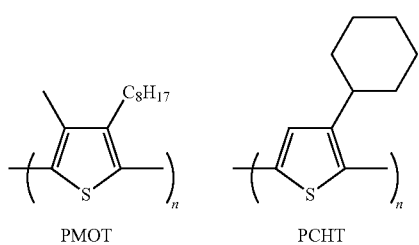

The first light emitting or conjugated polymer unit is then modified to form a second light emitting or conjugated polymer unit 230 with a second functional group B and a third functional group C on the two ends of its molecular structure, wherein the second functional group B is used to bond the first functional group A of the conductive or conjugated polymer film 220. Next, a membrane fabricating process is performed to form an light emitting or conjugated polymer film on the at least one patterned conductive or conjugated polymer film 220 by bonding the second functional group B of the second light emitting or conjugated polymer unit 230 to the first functional group A of the at least one patterned conductive or conjugated polymer film 220. The above mentioned first functional group A, second functional group B and third functional group C are selected from a group consisting of: sulfonic group, hydroxyl group, amine group, carboxylic acid group, epoxy group, isocyanate group, organic halide group, acyl halide group and aldehyde group. What should be noticed is that the second functional group B and the third functional group C can be the same, but if they are different, the second functional group B, rather than the third functional group C, has a stronger bonding ability towards the first functional group A. On the other hand, the first light emitting or conjugated polymer unit has a short-chain structure with less than 6 repeating units, in order to make sure the second functional group B and the third functional group C of the being on opposite ends of the second light emitting or conjugated polymer unit 230, and through which to keep the second functional group B and third functional group C of the second light emitting or conjugated polymer unit 230 from bonding the at least one patterned conductive or conjugated polymer film 220 simultaneously. The method provided in this embodiment can also be utilized to form the light emitting layer of an organic light emitting diode element.

Figure 11:
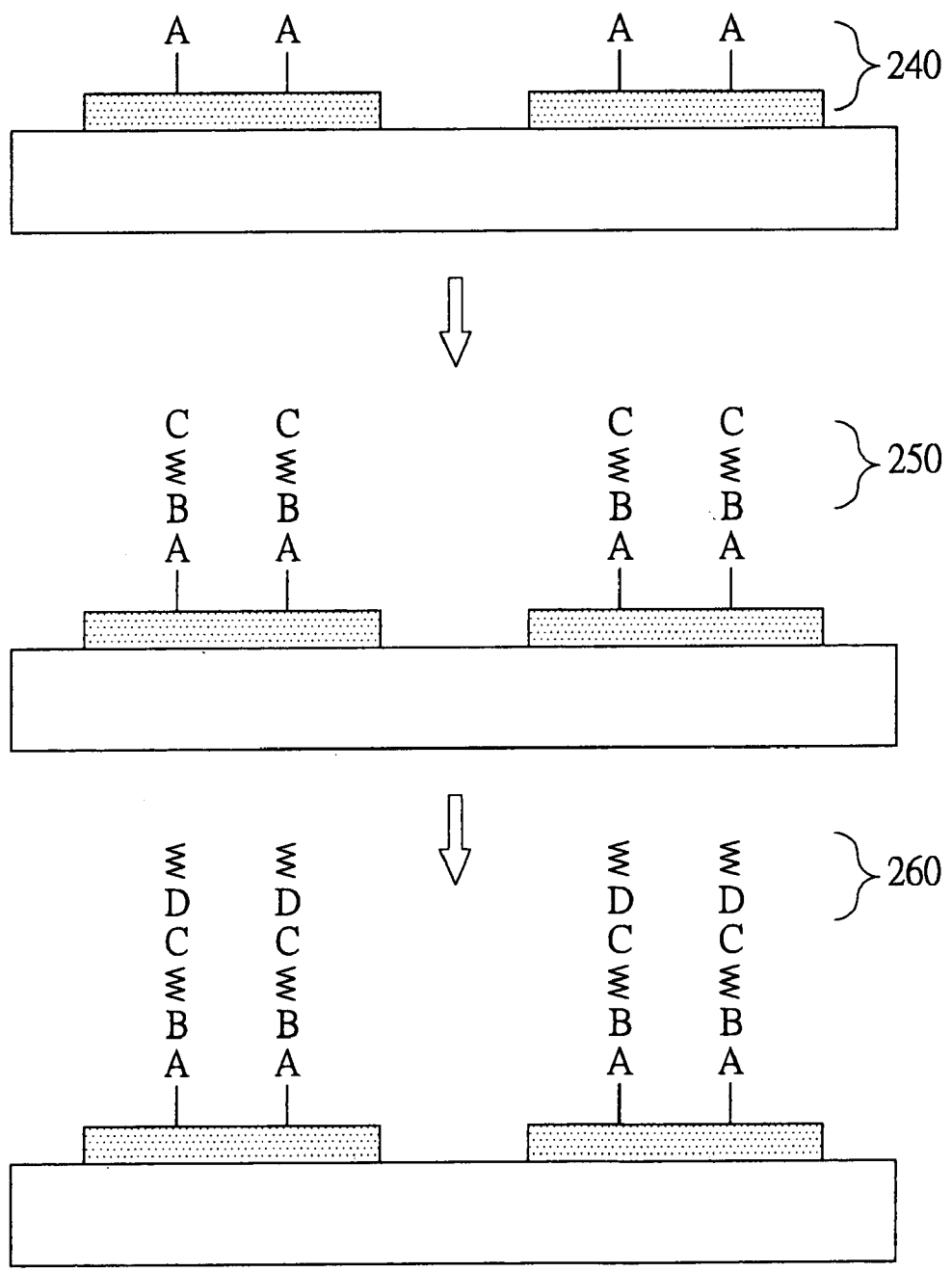
FIG. 11 is a schematic diagram of a method of a method of forming a light emitting or conjugated polymer film on a conductive or conjugated polymer film in, accordance with a sixth embodiment of the present invention, the method comprises (a) bonding a specific functional group of a connecting agent to another specific functional group of the conductive or conjugated polymer film, and then (b) bonding a still another functional group of a light emitting or conjugated polymer unit to the specific functional group of the connecting agent.

Referring to FIG. 11, in a fifth embodiment of the present invention, at least one patterned conductive or conjugated polymer film 240 is provided, the conductive or conjugated polymer film 240 has a first functional group A. Next, a connecting agent 250 with a second functional group B and a third functional group C is provided for performing a connecting process. The connecting agent 250 is selected from a group consisting of:

(1) diisocyanate family (with general formula as shown below, wherein R is selected from a group consisting of: alkyl group, benzene ring and any combination thereof.

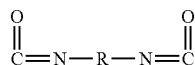

(2) dialdehyde family (with general formula as shown below, wherein R is selected from a group consisting of: alkyl group, benzene ring and any combination thereof).

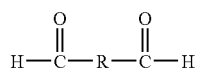

(3) dihalide family (with general formula as X—R—X, wherein R is selected from a group consisting of: alkyl group, benzene ring and any combination thereof, and X is Br, Cl or I.

(4) diorganohalide family, such as diacyl halide family (with general formula as shown below, wherein R is selected from a group consisting of: alkyl group, benzene ring and any combination thereof, and X is Br, Cl or I.

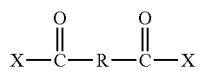

The connecting process is performed to bond the second functional group B of the connecting agent 250 to the first functional group A of the conductive or conjugated polymer film 240. After the connecting process, an light emitting or conjugated polymer unit 260 with a fourth functional group D is provided to bond the third functional group C of the connecting agent 250. Next, a membrane fabricating process is performed to form an light emitting or conjugated polymer film on the at least one patterned conductive or conjugated polymer film 240 by bonding the fourth functional group D of the light emitting or conjugated polymer unit 260 to the third functional group C of the connecting agent 250. The above mentioned first functional group A, second functional group B, third functional group C, and fourth functional group D are selected from a group consisting of: sulfonic group, hydroxyl group, amine group, carboxylic acid group, epoxy group, isocyanate group, organic halide group, acyl halide group and aldehyde group. What should be noticed is that the second functional group B and the third functional group C can be the same, but if they are different, the second functional group B, rather than the third functional group C, has a stronger bonding ability towards the first functional group A. On the other hand, the connecting agent 250 has a short-chain structure with less than 6 repeating units, in order to make sure the second functional group B and the third functional group C being on opposite ends of the connecting agent 250, and through which to keep the second functional group B and third functional group C of the connecting agent 250 from bonding the at least one patterned conductive or conjugated polymer film 240 simultaneously. The method provided in this embodiment can also be utilized to form the light emitting layer of an organic light emitting diode element.

As described above, the present invention discloses a method for forming a photresist agent. Common photoresist agents used in the semi-conductor manufacturing process has no specific functional groups as those mentioned above, thus the photoresist layer formed in the lithographic and etching steps has to be removed later, which costs additional time for the entire process. On contrary, by adding specific functional groups to the photoresist agent, the present invention can spare the photoresist layer removal step and directly utilize those added specific functional groups to link other chemical components that are to be added in the following steps. On the other hand, the present invention exploits t the molecular-scale design and interactions between different functional groups to produce a membrane from a conductive polymer unit and other chemical components. The method provided by the present invention has the advantage of putting several functional organic materials together into a single membrane. Also, present invention employs conductive particles a core-shell structure for synthesizing a conductive/light emitting membrane with high conductivity and transparency.

Accordingly, the present invention discloses a method for forming self-synthesizing conductive or conjugated polymer film and its application. First of all, at least one photoresist layer with a first functional group and a specific pattern is formed, so that the first functional group can bond a second functional group of a conductive or conjugated polymer unit, whereby a conductive or conjugated polymer film with specific pattern is formed. Furthermore, this invention can be applied for forming emitting films, especially for forming emitting layers of OLED/PLED elements.

Although only some specific embodiments have been illustrated and described, it will be obvious to those skilled in this art that various modifications may be made without departing from what is intended to be limited solely by the appended claims. Obviously, many modifications and variations of the present invention are possible in light of the above teachings. It is therefore to be understood that within the scope of the appended claims, the present invention may be practiced otherwise than as specifically described herein.

What is claimed is:

1. A method for forming a conductive membrane, comprising: providing a substrate; coating a photoresist agent with a sulfonic group on said substrate; performing a lithographic process so as to form at least one specifically patterned photoresist layer with a crosslinking structure on said substrate; modifying a first aniline oligomer so as to form a second aniline oligomer with a sulfonic group; ionizing said second aniline oligomer to make said second aniline oligomer to have a group containing nitrogen atoms and carrying a positive charge and a sulfonic group carrying a negative charge; ionizing said at least one specifically patterned photoresist layer on said substrate to make said photoresist layer to have a sulfonic group carrying a negative charge; and performing a membrane fabricating process to form a conductive membrane on said at least one specifically patterned photoresist layer by bonding said group containing nitrogen atoms and carrying a positive charge of said second aniline oligomer to said sulfonic group of said photoresist layer.

2. The method in claim 1, wherein said second aniline oligomer is ionized by an acid solution.

3. The method in claim 2, wherein said acid solution is selected from a group consisting of: HCl solution, ammonium persulfate(APS) solution, dl-10-camphorsulfonic acid(CSA) solution, dodecylbenzene sulfonic acid(DBSA) solution, alkylbenzene sulfonic acid solution, and derivatives thereof.

4. The method in claim 1 wherein said conductive or conjugated polymer film fabricating process is performed in an acid solution.

5. The method in claim 4, wherein said acid solution is selected from a group consisting of: HCl solution, ammonium persulfate(APS) solution, dl-10-camphorsulfonic acid(CSA) solution, dodecylbenzene sulfonic acid(DBSA) solution, alkylbenzene sulfonic acid solution, and derivatives thereof.

* * * * *